(12) United States Patent
Gorman et al.

(10) Patent No.: US 7,631,236 B2
(45) Date of Patent: Dec. 8, 2009

(54) HYBRID BUILT-IN SELF TEST (BIST) ARCHITECTURE FOR EMBEDDED MEMORY ARRAYS AND AN ASSOCIATED METHOD

(75) Inventors: Kevin W. Gorman, Fairfax, VT (US); Adrian J. Paparelli, Milton, VT (US); Michael A. Roberge, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/057,405

(22) Filed: Mar. 28, 2008

(65) Prior Publication Data

US 2008/0178053 A1      Jul. 24, 2008

Related U.S. Application Data

(63) Continuation-in-part of application No. 10/707,971, filed on Jan. 29, 2004, now Pat. No. 7,401,281.

(51) Int. Cl.
*G01R 31/28* (2006.01)
*G06F 11/00* (2006.01)
*G11C 29/00* (2006.01)

(52) U.S. Cl. .................. 714/733; 714/744; 714/718

(58) Field of Classification Search .............. 714/718, 714/719, 724, 726, 728, 729, 731–734, 744
See application file for complete search history.

(56) References Cited

U.S. PATENT DOCUMENTS

| 5,614,838 | A | 3/1997 | Jaber et al. |
| 5,689,466 | A | 11/1997 | Qureshi |
| 5,754,758 | A | 5/1998 | Baeg et al. |
| 5,796,745 | A | 8/1998 | Adams et al. |
| 5,805,611 | A | 9/1998 | McClure |

(Continued)

FOREIGN PATENT DOCUMENTS

DE          100 60 436          5/2000

OTHER PUBLICATIONS

Dear, et al., "Test Strategy Planning Using Economic Analysis," Journal of Electronic Testing, vol. 5, 1994, pp. 137-155.

(Continued)

*Primary Examiner*—Cynthia Britt
(74) *Attorney, Agent, or Firm*—Gibb I.P. Law Firm, LLC; Michael LeStrange, Esq.

(57) ABSTRACT

Disclosed are embodiments of a built-in self-test (BIST) architecture that incorporates a standalone controller that operates at a lower frequency to remotely perform test functions common to a plurality of embedded memory arrays. The architecture also incorporates command multipliers that are associated with the embedded memory arrays and that selectively operate in one of two different modes: a normal mode or a bypass mode. In the normal mode, instructions from the controller are multiplied so that memory array-specific test functions can be performed locally at the higher operating frequency of each specific memory array. Whereas, in the bypass mode, multiplication of the instructions is suspended so that memory array-specific test functions can be performed locally at the lower operating frequency of the controller. The ability to vary the frequency at which test functions are performed locally, allows for more test pattern flexibility.

35 Claims, 11 Drawing Sheets

U.S. PATENT DOCUMENTS

| | | | |
|---|---|---|---|
| 5,822,228 | A | 10/1998 | Irrinki et al. |
| 5,930,814 | A | 7/1999 | Lepejian et al. |
| 5,961,634 | A | 10/1999 | Tran |
| 6,055,658 | A | 4/2000 | Jaber et al. |
| 6,085,346 | A | 7/2000 | Lepejian et al. |
| 6,343,366 | B1 | 1/2002 | Okitaka |
| 6,509,766 | B1 | 1/2003 | Pomichter et al. |
| 6,510,530 | B1 | 1/2003 | Wu et al. |
| 6,550,033 | B1 | 4/2003 | Dwork |
| 6,779,144 | B2 | 8/2004 | Hayashi et al. |
| 6,978,402 | B2 * | 12/2005 | Hirabayashi ............... 714/42 |
| 6,993,696 | B1 * | 1/2006 | Tanizaki et al. ............ 714/744 |
| 7,437,636 | B2 * | 10/2008 | Rajski et al. ............... 714/726 |
| 2002/0059543 | A1 | 5/2002 | Cheng et al. |
| 2002/0170003 | A1 | 11/2002 | Hirabayashi |
| 2002/0171447 | A1 | 11/2002 | Ernst et al. |
| 2003/0034791 | A1 | 2/2003 | Huang et al. |
| 2004/0085082 | A1 | 5/2004 | Townley |
| 2005/0120270 | A1 | 6/2005 | Anand et al. |
| 2005/0193253 | A1 | 9/2005 | Fales et al. |

OTHER PUBLICATIONS

Powell, et al., "BIST for Deep Submicron ASIC Memories with High Performance Application," Proceedings IEEE int. Test Conf., 2003, pp. 386-393.

Gorman, et al., "Low Cost Test of High Bandwidth Embedded Memories," Proceedings IEEE Custom Integrated Circuits Conf., 2006, pp. 445-448.

Dreibelbis, et al., "Processor Based Built-in Self Test for Embedded DRAM," IEEE Journal of Solid State Circuits, vol. 33, No. 11, 1998, pp. 1731-1740.

Horowitz, et al., "Low-Power Digital Design," Proceedings IEEE Symp. on Low Power Electronics, 1994, pp. 8-11.

Kirihata, et al., "An 800-MHz Embedded DRAM with a Concurrent Refresh Mode," IEEE Journal of Solid State Circuits, vol. 40, No. 6, 2005, pp. 1377-1387.

Huang, et al., "A High-Speed Built-In-Self-Test for DRAMs," Proceedings Int. Symp. On VLSI Technology Systems and Applications, 1999, pp. 50-53.

* cited by examiner

BIST Instruction Definition

| Instruction Bits | Description |
|---|---|
| 35 | Data/Execution Instruction |
| 34 | Branch Enable |
| 33-28 | Branch Address |
| 27-23 | Branch Type |
| 22-20 | Bank Address Control |
| 19-17 | Row Address Control |
| 16-14 | Column Address Control |
| 13-11 | Refresh Bank Address Control |
| 10 | Increment/Decrement Toggle |
| 9 | Offset Counter Enable |
| 8 | Data Pattern |
| 7 | Bit Write |
| 6 | Data True/Complement Toggle |
| 5-1 | Array Command |
| 0 | Reserved |

Figure 5

BIST Controller Address Generator. P indicates pipe sate. Programmable max, min and home values not shown Command multiplier memory control logic. C0-C3 indicates programmable memory controls for mCount cycles 0 to 3.

Command multiplier address generation logic.
C0-C3 indicates counter controls for mCount
cycles 0 to 3. C0 is always set to Load.

Command multiplier data generation logic. C0-C3
indicates data controls for mCount cycles 0 to 3.

Timing diagram for synchronization of data between BIST and command multiplier logic.

HYBRID BUILT-IN SELF TEST (BIST) ARCHITECTURE FOR EMBEDDED MEMORY ARRAYS AND AN ASSOCIATED METHOD

CROSS-REFERENCE TO RELATED APPLICATIONS

The present invention claims the benefit under 35 U.S.C. §120 as a continuation-in-part of presently U.S. patent application Ser. No. 10/707,971 entitled "REMOTE BIST FOR HIGH SPEED TEST AND REDUNDANCY CALCULATION", filed on Jan. 29, 2004 now U.S. Pat. No. 7,401,281, the entire teachings of which are incorporated herein by reference.

FIELD OF THE INVENTION

The present invention relates to built-in self test (BIST) architectures and more particularly, to an architecture for embedded memory arrays that segments BIST functionality into remote executable instructions and local executable instructions.

DESCRIPTION OF THE RELATED ART

As embedded memory sizes continue to increase, overall built-in self test (BIST) testing time will also increase; hence, novel schemes that reduce testing time while maintaining test integrity and diagnostic resolution are of great value.

In current and future designs, there is a need to separate and distribute memory arrays across a die in order to place them near the functional units to which they are associated. To associate a separate BIST architecture with each memory array on the die would consume a considerable amount of chip real estate. An architecture that provides for a single BIST that could test all the memories without significant extra time for testing would be advantageous given the above stated trend.

As embedded memory performance and complexity continues to increase, BIST testing at application speeds also becomes more important; hence, novel schemes that support increased BIST performance, while still maintaining BIST flexibility and minimizing design schedule and chip real estate impact are of great value. An architecture that allows for a single BIST that can test a diverse range of memory types and sizes at a number of different performance points would be advantageous.

SUMMARY OF INVENTION

In view of the foregoing the present invention provides embodiments of a hybrid built-in self test (BIST) architecture for embedded memory arrays and an associated BIST method. These embodiments segment BIST functionality into remotely executable instructions and locally executable instructions.

Previously disclosed embodiments of the present invention provide a hybrid built-in self-test (BIST) architecture that allows for testing of a diverse range of memory types and sizes at a number of different performance points. Specifically, the previously disclosed embodiments each comprise a standalone (i.e., remote) BIST logic controller that operates at a lower frequency to remotely perform test functions common to a plurality of embedded memory arrays and further communicates with those embedded memory arrays using a BIST instruction set for locally performing additional memory array-specific test functions. A block of higher-speed test logic is incorporated into each embedded memory array under test and locally processes the BIST instructions received from the standalone BIST logic controller. Theses instructions are processed by the blocks of test logic at a higher frequency than that of the BIST logic controller. To accomplish this, each higher-speed test logic includes a multiplier for increasing the frequency of the BIST instructions from the lower frequency to the higher frequency.

The newly disclosed embodiments of the present invention similarly comprise a standalone (i.e., remote) BIST logic controller that operates at a lower frequency than the embedded memory arrays. However, in the newly disclosed embodiments, command multipliers are associated with the embedded memory arrays and selectively operate in one of two different modes: a normal mode or a bypass mode. In the normal mode, instructions from the BIST logic controller are multiplied so that memory array-specific test functions can be performed locally at the higher operating frequency of each specific embedded memory array. Whereas, in the bypass mode, multiplication of the instructions is suspended so that memory array-specific test functions can be performed locally at the lower operating frequency of the controller. The ability to vary the frequency at which test functions are performed locally, allows for more test pattern flexibility.

More particularly, disclosed herein are embodiments of a hybrid built-in self test (BIST) architecture for embedded memory arrays that allows for BIST functionality to be segmented into remotely executable instructions and locally executable instructions. This BIST architecture can comprise a remote BIST logic controller and command multipliers each associated with a specific embedded memory array.

The BIST logic controller is separate from and in communication with each command multiplier (e.g., via a bus). The BIST logic controller can be adapted to remotely perform some test functions (e.g., initial test functions that are common to all of the embedded memory arrays) and to perform those initial test functions at a lower operating frequency than the normal operating frequency of each of the embedded memory arrays. The BIST logic controller can further be adapted to communicate, to each command multiplier, generic instructions for performing additional test functions locally on each specific embedded memory array.

Each command multiplier can be adapted to translate or decode the generic instructions into the commands necessary for performing the additional test functions locally. These commands, as translated, can be memory array-specific.

Additionally, each command multiplier can be adapted to selectively operate in one of multiple different modes, as specified in the instructions. These operating modes can include a normal mode and a bypass mode. When operating in a normal mode, a specific command multiplier receives the instructions from the BIST logic controller and multiplies those instructions. Multiplication of the instructions allows memory array-specific test functions to be performed locally on a specific embedded memory array at the same higher operating frequency as that specific embedded memory array. For example, each embedded memory array can have a normal operating frequency that is n times the lower operating frequency of the BIST logic controller. The value of n can vary between different embedded memory arrays. Therefore, although each embedded memory array receives the same set of instructions from the BIST logic controller, when operating in the normal mode, each specific command multiplier will multiple the instructions by the number n of the specific embedded memory array to which it is associated. Thus, in the normal mode, the higher operating frequency at which the additional testing functions are performed on different memory arrays may differ. Contrarily, when operating in a bypass mode, multiplication of the instructions is temporarily suspended so that the memory-array specific test functions are performed locally at the lower operating frequency of the BIST logic controller.

By providing command multipliers with multiple different operating modes, the embodiments disclosed herein provide options for balancing testing flexibility with operating speed. For example, the normal mode allows the additional test functions to be performed at the higher operating frequency with limitations on test pattern flexibility. Whereas, the bypass mode allows the additional test functions to be performed at the lower operating frequency without the limitations on test pattern flexibility.

The BIST architecture embodiments disclosed herein can also include several other features. For example, the BIST architecture can comprise synchronization circuits to provide synchronization between the command multipliers and the BIST logic controller. These synchronization circuits can comprise either separate circuits connected between the command multipliers and the controller or embedded circuits within the command multipliers. The BIST architecture embodiments can also comprise a hierarchical address scheme. That is, the BIST logic controller can comprise an address generator adapted to generate initial addresses and each command multiplier can comprise another address generator adapted to generate final addresses within the each specific embedded memory array. Other features of the BIST architecture embodiments relate to the decode functions of the command multiplier. For example, the command multiplier can be adapted to support programmable command sequences and/or to provide data scrambling specific to the corresponding embedded memory array.

Also, disclosed herein are embodiments of a method for performing a hybrid built-in self-test process in conjunction with the BIST architecture, described above. The method embodiments comprise remotely performing, by a BIST logic controller, initial test functions that are common to a plurality of embedded memory arrays. These initial test functions can be performed at the lower operating frequency of the BIST logic controller rather than at the higher operating frequency of the various embedded memory arrays.

Additionally, the method embodiments can comprise communicating, by the BIST logic controller to a plurality of command multipliers, generic instructions for performing additional test functions locally. The same set of generic instructions can be communicated to each command multiplier and these generic instructions can specify the operating mode to be used by the individual command multipliers. Optionally, in order to ensure the correct transfer of data during this communication process, timing between the controller and the various command multipliers can be individually synchronized.

Once the instructions have been received, the command multipliers can each selectively operate in either a normal mode or a bypass mode, as specified in the instructions. For each specific command multiplier, operating in the normal mode comprises multiplying the instructions so that the additional test functions are performed on a specific embedded memory array at the higher operating frequency of the specific embedded memory array. For example, each specific embedded memory array can have a normal operating frequency that is n times a lower operating frequency (e.g., n times the lower operating frequency of the BIST logic controller). The value of n can vary between different embedded memory arrays that are connected to the same BIST logic controller. Thus, for each specific command multiplier, operating in the normal mode comprises multiplying each of the instructions in the set by the n value of a specific embedded memory array. If multiple embedded memory arrays are each in communication with the same BIST logic controller and these embedded memory arrays have different n values, then the same set of the instructions may be multiplied by a different factor n depending upon the memory array being tested. Thus, when operating in the first mode, additional test functions may be performed locally on different embedded memory arrays at varying frequencies. Contrarily, operating in the bypass mode comprises temporarily suspending multiplication of the instructions so that the additional test functions are performed at the lower operating frequency of the BIST logic controller. Thus, when operating in the bypass mode, additional testing functions are performed locally by different embedded memories at the same lower frequency of the BIST logic controller.

By selectively performing memory array-specific test functions in one of multiple different modes, the method embodiments provide options for balancing testing flexibility with operating speed. For example, performing the additional test functions locally in the normal mode allows the additional test functions to be performed at the higher operating frequency with limitations on test pattern flexibility. Whereas, performing the additional test functions locally in the bypass mode allows the additional test functions to be performed at the lower operating frequency without the limitations on test pattern flexibility.

The method embodiments can further comprise translating or decoding the generic instructions into the necessary commands for performing the additional test functions locally. This translation or decoding process can be performed by each specific command multiplier and can be memory array-specific.

The BIST method embodiments disclosed herein can also include several other features. For example, the BIST method embodiments can comprise using a hierarchical address counter scheme. Other features of the BIST method embodiments relate to the decoding process and can comprise, in each of the embedded memory arrays, locally supporting programmable command sequences and/or locally providing data scrambling such that the data scrambling is memory array-specific.

These, and other, aspects and objects of the present invention will be better appreciated and understood when considered in conjunction with the following description and the accompanying drawings. It should be understood, however, that the following description and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which:

FIG. 5 is a table illustrating exemplary BIST instruction definitions;

DETAILED DESCRIPTION

Figure 1:
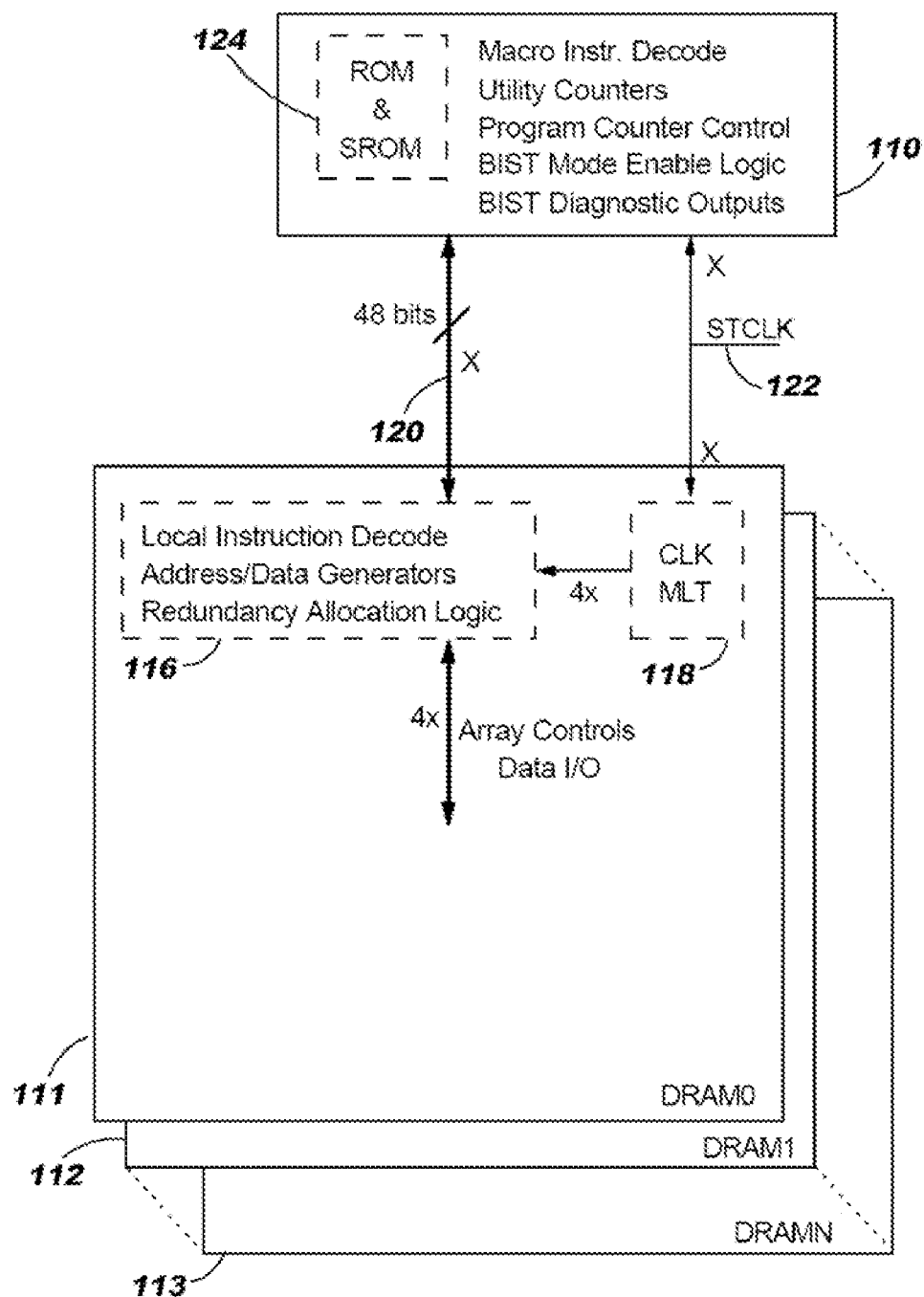
FIG. 1 is a schematic diagram illustrating an embodiment hybrid built-in self-test (BIST) architecture of the present invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, the speeds of BIST testing at application have become increasingly important. The present invention provides hybrid built-in self-test (BIST) architecture that allows for testing of a diverse range of memory types and sizes at a number of different performance points.

DESCRIPTION OF PREVIOUSLY DISCLOSED EMBODIMENTS

The previously disclosed embodiments of the present invention comprise a standalone (i.e., remote) BIST logic controller that operates at a lower frequency to remotely perform test functions common to a plurality of embedded memory arrays and further communicates with those embedded memory arrays using a BIST instruction set for locally performing memory array-specific test functions. A block of higher-speed test logic is incorporated into each embedded memory array under test and locally processes the BIST instructions received from the standalone BIST logic controller. These instructions are processed by the blocks of test logic at a higher frequency than that of the BIST logic controller. To accomplish this, each higher-speed test logic includes a multiplier for increasing the frequency of the BIST instructions from the lower frequency to the higher frequency.

More specifically, the previously disclosed embodiments of the present invention, as illustrated in FIG. 1, comprise a single remote BIST master engine 110 which is in communication with at least one embedded block of test logic 116 through a bus 120. Each of the embedded memory macros, such as DRAM0-DRAMn (111-113), has an embedded block of test logic 116 and a clock multiplier 118 (that can be separate from the block of test logic 116, as shown in FIG. 1, integrated with the block of test logic 116, or physically remote from the macros 111-113 and shared among them). Item 122 represents the system clock supplied to BIST logic controller 110 and the embedded blocks of test logic 116 (and/or multiplier 118).

The remote BIST engine 110 runs at slow frequencies (Nx slower than local instruction decode logic/RAL logic 116 contained in each DRAM macro 111-113). In the example shown in FIG. 1, N is 4. The BIST logic controller 110 contains a ROM/SROM 124 for BIST test pattern storage (the SROM is re-loadable with a new test pattern from the off-chip test apparatus and/or the tester). Other memory types may be used for pattern storage. The BIST logic controller 110 also includes the logic necessary for branch prediction/program counter management, utility counting, and logic for handling general BIST operational control and diagnostic outputs. The logic necessary for branch prediction/program counter management controls how the BIST test pattern is executed. The logic actually adjusts the ROM/SROM 124 address pointer based upon the decode of a portion of the BIST test pattern instruction and an examination of all relevant branch conditions (typically related to utility counter states and inputs from other test logic and/or the tester). The logic used for utility counting consists of a number of programmable counters that allow the BIST logic controller 110 to execute an instruction a number of times until the programmed count is obtained. The logic used for general BIST logic controller 110 operational control and diagnostic outputs allows the BIST 110 to interact with the tester and other on-chip test macros. The logic can enable/disable or otherwise pause the BIST logic controller 110 during execution, control bit fail mapping, allow for observation of the current BIST state, reprogram the SROM 124 BIST pattern instructions, and change test modes (or other settings) in the embedded blocks of test logic 116 (and/or the clock multiplier 118 and DRAM macros 111-113). This logic, together with the ROM/SROM 124, is the portion that is common to all DRAM macro testing. Approximately 75% of the logic comprising the BIST test engine 110 would be contained in this remote portion.

The clock multiplier circuit 118 allows the local instruction decode logic to run at the multiplied frequency of x when required, namely, at speed with the DRAM 111-113. The local decode logic 116 includes redundancy allocation logic, data/address/control generation logic, and settings to control decode (for example, settings to decode remote BIST macro commands into N individual micro-instructions that control local address counters and data generators and create array controls at speed).

A portion of the local decode logic 116 uses the locally stored test modes/settings to properly decode and multiply a single macro-instruction from the remote BIST logic controller 110 and produce N individual micro-instructions. A single micro-instruction is decoded in a manner that is modified by the locally stored settings, such that commonly designed local decode logic 116 can produce micro-instructions tailored to a particular embedded memory. The micro-instruction outputs of this portion of the local decode logic 116 in turn control the data/address/control generation portion of the local decode logic 116. The micro-instruction determines the sequence in which the address counter logic increments/decrements to produce addresses, modifies the data pattern logic that generates various data-types, and updates the embedded macro control logic that creates controls (read, write, refresh, match, etc.) for the embedded array. The address/data/controls that are generated are then applied as stimulation to the embedded array under test. The redundancy allocation logic portion of the local decode logic 116 compares expected data with what is currently being read from the embedded memory DRAM 111-113. When stimulations from the data/address/control generation portion of the local decode 116 result in a miscompare or fail between the data and the expected data, the redundancy allocation logic assigns a redundant element to repair the fail. It should be noted that this local decode logic 116 can be modified in software via the local settings or in hardware via physical changes. These changes allow for the local decode logic 116 to suit the memory size and type under test, i.e., the same remote BIST logic controller 110 can control multiple local decode logic blocks 116 that have been modified to appropriately stimulate a particular embedded memory type (DRAM, CAM, SRAM, etc.) size or frequency.

The local portion of the testing logic 116 (not counting the redundancy allocation logic, which can be implemented in a variety of ways independent of the BIST architecture) comprises the remaining 25% of the test logic. Therefore, the invention substantially reduces the amount of BIST circuitry that is included within each of the embedded memories, thereby saving space and substantially increasing BIST speed. One BIST macro command at frequency x, creates N array commands at frequency Nx, or 1 test mode set command at frequency x. Thus, the invention can generate an initial command at a lower frequency that applies multiple operations to multiple addresses at a higher frequency, or can simply send a single command controlling the mode of testing or changing other settings. However, these previously disclosed embodiments are limited with regard to testing flexibility because locally performed test functions are always performed at the higher frequency of the embedded memory array.

Description of Currently Disclosed Embodiments

Therefore, disclosed herein are additional embodiments that similarly comprise a standalone (i.e., remote) BIST logic controller that operates at a lower frequency than the embedded memory arrays. However, in the newly disclosed embodiments, command multipliers are associated with the embedded memory arrays and selectively operate in one of two different modes: a normal mode or a bypass mode. In the normal mode, instructions from the BIST logic controller are multiplied so that memory array-specific test functions can be performed locally at the higher operating frequency of the specific embedded memory array. Whereas, in the bypass mode, multiplication of the instructions is suspended so that memory array-specific test functions are performed locally at the lower operating frequency of the controller. The ability to vary the frequency at which test functions are performed locally, allows for more test pattern flexibility.

Figure 2:
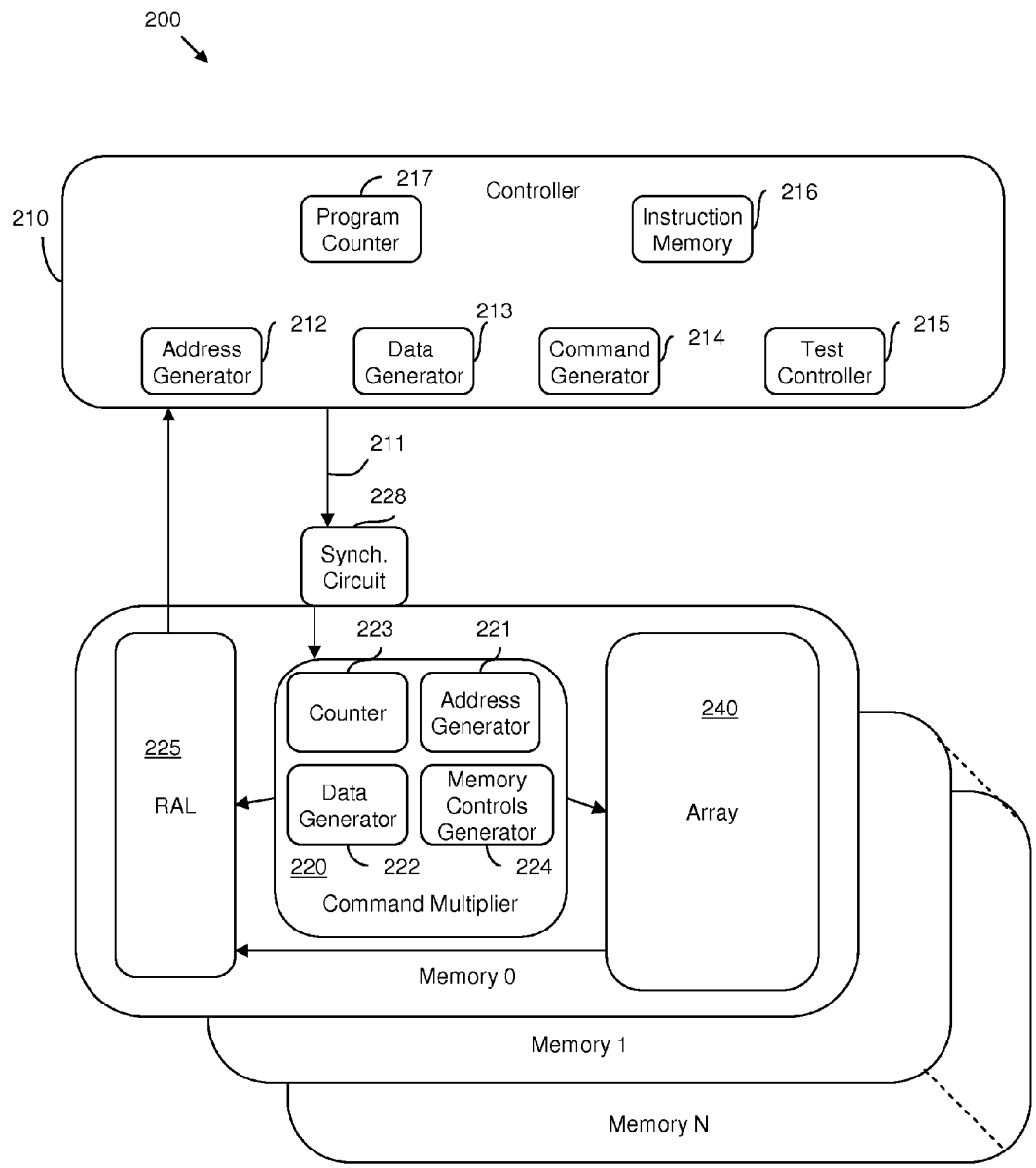
FIG. 2 is a schematic diagram illustrating embodiment hybrid built-in self-test (BIST) architecture of the present invention.

Referring to FIG. 2, disclosed herein are embodiments of a hybrid built-in self test (BIST) architecture 200 for embedded memory arrays 240. This BIST architecture 200 can comprise a remote BIST logic controller 210 (i.e., a BIST engine 210) and command multipliers 220, each associated with a specific embedded memory array 240. As with the previously described embodiments, the architecture 200 allows for BIST functionality to be segmented into remotely executable instructions and locally executable instructions.

The BIST logic controller 210 is separate from and in communication with each command multiplier 220 (e.g., via low speed bus 211). The BIST logic controller 210 can be adapted to remotely perform some test functions (e.g., test functions that are common to all of the embedded memory arrays) and to perform those test functions at a lower operating frequency (i.e., at an operating frequency that is lower than the normal operating frequency of each of the embedded memory arrays). The BIST logic controller 210 can further be adapted to produce and communicate to the command multipliers 220 an address bus (see address generator 212), a set of generic instructions or commands (e.g., 5-bit command instructions) for locally performing additional test functions (see command generator 214) and data patterns which can be used to test a wide variety of circuits under test (see data generator 213).

Each command multiplier 220 can be adapted to receive and decode the same set of generic instructions. Specifically, the command multiplier can be adapted to translate the address bus into the format required for the specific embedded memory array 240 (e.g., see address generator 221). The command multiplier 220 can also be adapted to scramble the data patterns based on the address sequencing to produce physical or logical checkerboard, blanket and other more exotic data sequences necessary for test of the specific embedded memory array 240 (see data generator 222).

The command multiplier 220 can further be adapted to receive and accept each generic command (comprising, for example, an x-bit word command, such as a 5-bit word command) in the set of instructions sent from the engine 210 and to decode (i.e., translate) each instruction into the controls needed by the memory 240 under test (i.e., into the control needed for performing the additional test functions locally) (see memory controls generator 224). The commands, as translated, can be memory array-specific (i.e., they can be specific to the embedded memory array 240 to which the specific command multiplier 220 is associated). For example, different command multipliers may interpret (i.e., translate) the same set of instructions in a different manner, depending upon the memory array type (e.g., dynamic random access memory (DRAM), static random access memory (SRAM), content-addressable memory (CAM), etc.), size, frequency, etc.

Additionally, each command multiplier 220 can be adapted to selectively operate in one of multiple different modes, as specified in the instructions from the BIST logic controller 210 (see counter 223). Specifically, the instructions received from the controller 210 can contain a code that specifies which of the multiple different operating modes should be used when performing the additional test functions. These operating modes can include, but are not limited to, the following modes: a normal mode (i.e., a first mode) and a bypass mode (i.e., a second mode).

Figure 3:
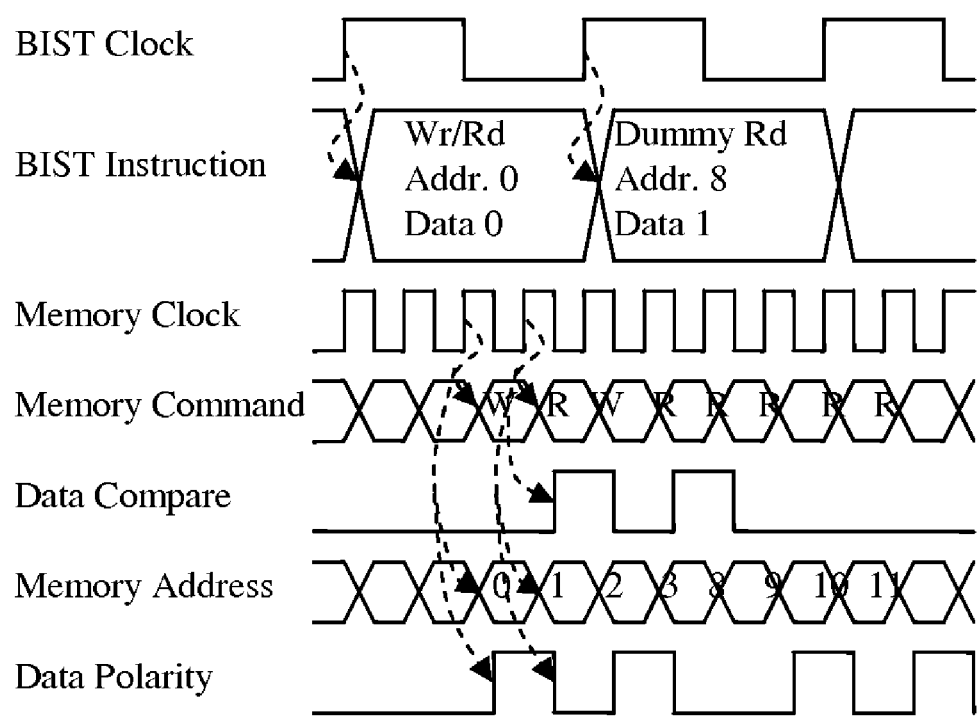
FIG. 3 is a timing diagram.

When operating in a normal mode, a specific command multiplier 220 receives the instructions from the BIST logic controller 210 and multiplies those instructions. Once multiplied and decoded (see discussion below), the instructions are used for performing the additional test functions on a specific embedded memory array 240 at the same operating frequency as that specific embedded memory array. That is, the instructions are multiplied so that they are performed locally at the higher frequency of the specific embedded memory array. For example, each embedded memory array 240 can have a normal operating frequency that is n times the lower operating frequency x of the BIST logic controller. The value of n can vary between different embedded memory arrays 240. Therefore, although each embedded memory array receives the same set of relatively generic instructions from the BIST logic controller, when operating in the normal mode, each specific command multiplier will multiple the instructions by the number n of the specific embedded memory array to which it is associated. This can be accomplished in a way that is analogous to the clock multiplier in the previously described embodiments (see clock multiplier 118 of FIG. 1). That is, each command multiplier receives the instructions from the BIST engine 210 at frequency x and then, using counter 223, produces test sequences for the memory 240 under test at frequency n*x (i.e., for every 1 BIST instruction the command multiplier 210 produces n test sequences). Thus, in the normal mode, the higher operating frequency at which the additional testing functions are performed locally may differ. FIG. 3 illustrates this multiplication process.

Contrarily, when operating in a bypass mode, that same specific command multiplier 220 can receive instructions from the BIST logic controller 210; however, the counter 223 can suspend multiplication of the instructions so that the additional test functions (i.e., memory array-specific instructions) are performed locally on the specific embedded memory array 240 at the lower operating frequency of the BIST logic controller 210. Thus, when operating in the bypass mode, the lower operating frequency at which the additional testing functions are performed by the various command multipliers 220 on the different embedded memory arrays 240 is the same.

By providing command multipliers 220 with multiple different operating modes, the embodiments disclosed herein provide options for balancing testing flexibility with operating speed. For example, the normal mode allows the additional test functions to be performed at the higher operating frequency (i.e., the same operating frequency as the corresponding embedded memory array) with limitations on test pattern flexibility. Whereas, the bypass mode allows the additional test functions to be performed at the lower operating frequency without the limitations on test pattern flexibility.

The BIST architecture embodiments disclosed herein can also include several other features. For example, the BIST architecture 200 can comprise synchronization circuits 228 to provide synchronization between the command multipliers and the BIST logic controller. These synchronization circuits 228 can comprise either separate circuits connected between each of the command multipliers 220 and the controller 210 (as illustrated) or embedded circuits within the command multipliers 220.

The BIST architecture embodiments can also comprise a hierarchical address scheme. That is, the BIST logic controller 210 can comprise an address generator 212 (i.e., a first or remote address generator) adapted to generate initial addresses. Additionally, each command multiplier 220 can comprise another address generator 221 (i.e., a second or local address generator) adapted to generate final or local addresses within the each specific embedded memory array. Other features of the BIST architecture embodiments relate to the functions of the command multiplier. For example, the command multiplier 220 can be adapted to support programmable command sequences and/or to provide data scrambling specific to the corresponding embedded memory array.

Finally, the data output from the memory 240 after test can be collected locally (e.g., by redundancy allocation logic 225) for comparison between expect data and system data and for generation of repair data.

Figure 4:
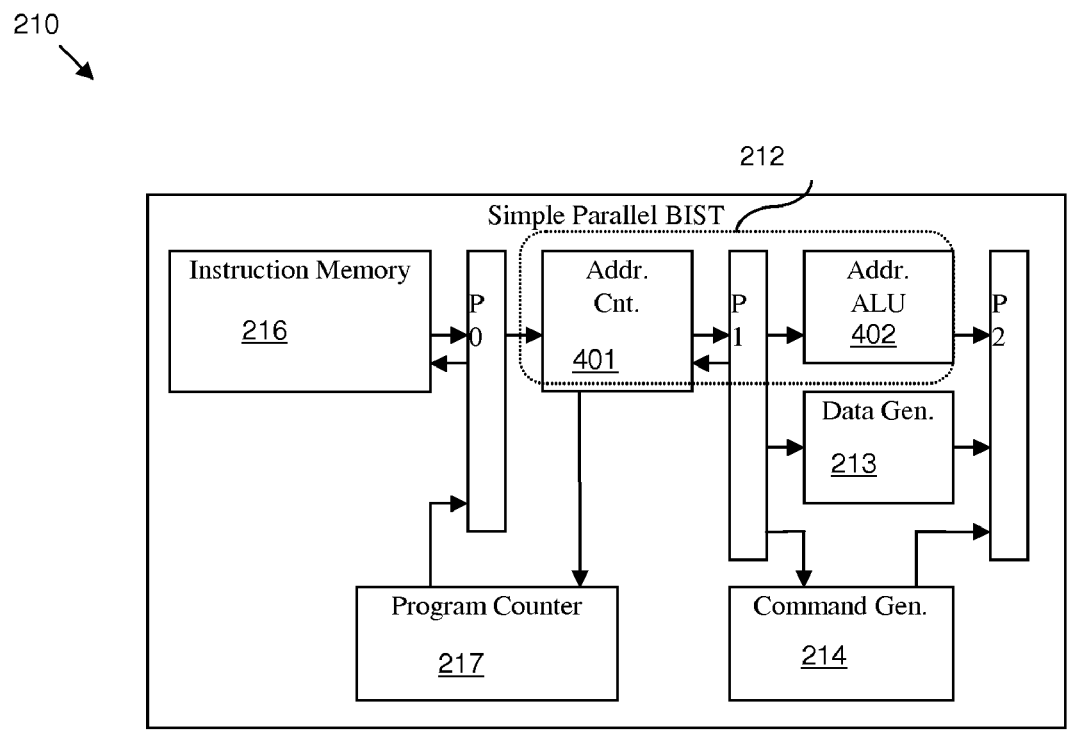
FIG. 4 is a schematic diagram illustrating an exemplary controller that can be incorporated into the BIST architecture of FIG. 2.

More specifically, referring to FIG. 4, the BIST engine 210 can comprise a conventional programmable parallel BIST architecture. A typical test sequence using a BIST engine 210 of this type can comprise loading a pattern into the programmable memory, execute the pattern (often a complex series of memory test sequences, analogous to several March patterns), query the BIST for status, and then load a new pattern into the BIST. The BIST engine 210 discussed herein can, for example, be designed to work at 250 MHz, processing a new BIST instruction every cycle.

This BIST type 210 can use a synthesized programmable memory 216 to store instructions. This memory 216 can be adapted to store the BIST program instructions, which direct BIST operations, and can be reloaded via a serial mechanism. Specifically, the instructions memory 216 can be adapted to store, for example, 36 bits by 31 words (i.e., large enough to store 31 instructions). It can be loaded on reset to a default March-9 test pattern that is used for running pass/fail screens or self-repair in system. Additionally, it can be reloaded via a simple serial interface with either the tester or a JTAG module (a shift enable, clock and data pin are all that is necessary).

The BIST instruction memory 216 can further be adapted to support two types: data instructions and execution instructions. The data instructions contain an address field and a data field so that when a data instruction is executed, the address field enables a particular register in the test circuitry (located in the BIST engine, command multiplier, clock generation, self repair, or memory circuits) to capture the data field. In this manner all test operations can be controlled via the BIST programmable memory 216, obviating the need for scan or other serial control of these registers. As illustrated in the table of FIG. 5, the execution instruction can contain many more fields. There can be fields devoted to controlling the program counter 217 (e.g., branch enable, branch address, branch type), address counter 212 (e.g., bank, row, column, and refresh bank addresses and the offset counter enable), toggle bits to modify address counter 212 and/or data generator 213 behavior (e.g., for increment/decrement, data true/complement), data fields used by the data generator 213 (e.g., data pattern of 1's or 0's, and bit write enable/disable), and the controls for the array command generator 214.

The program counter 217 can be adapted to index through the instruction memory 216 and to support branching/looping. Specifically, the program counter 217 can be adapted to jump directly to a new instruction address, branch to an instruction address until either a memory address counter (or a combination of address counters) has carried, or branch to an instruction address until the tester/JTAG provide a pulse on the BIST data pin. Basic push/pop operations for a simple two deep stack are also supported, along with special jump operations that also modify the memory address offset counter. The program counter logic 217 can be adapted to always assume a branch will be taken; incurring a two cycle pipeline stall in the BIST pattern execution whenever it falls through a branch after the condition has been satisfied.

The control, data, and address generators 212-214 can be adapted to decode instructions from the instruction memory 216 and to generate addresses, data/bit-write controls, and memory commands, respectively, to be communicated to the command multiplier 220. Specifically, the memory commands generated by the command generator 214 can be passed straight from the instruction being executed to the command multiplier 220. The memory command is only modified when data type instructions or pipeline stalls are being processed. This stall manifests itself as two cycles of memory no-ops (which should be translated by the command multiplier into 2*N cycles of no read/write/refresh operations). All data instructions are essentially treated as one BIST cycle of memory no-ops.

The data/bit write controls generated by the data generator 213 can be even more simplified. The data output from the BIST engine 210 is a logical XOR of the data bit toggle latch (which changes state whenever the data toggle field is asserted in an instruction) and the instruction data pattern value. The bit write is simply set to the current instruction's bit write value. In a typical BIST design the data pattern is modified or scrambled by logic that takes into account the BIST address for producing various data backgrounds in the memory under test. Logical and physical varieties of checkerboard, blanket, and row or column stripes are generated. This generation relies on knowledge of the physical architecture of the memory, and since the BIST is a simplified design that is architected to work with any memory type this is not possible. Instead, this scrambling is performed inside the command multiplication circuits, which are designed to work with a specific memory design.

As mentioned above, the BIST architecture 200 can comprise a hierarchical addressing scheme in which BIST controller 210 comprises on address generator 212 adapted to generate initial base or seed addresses and the command multipliers 220 can each have their own address generators 221 for generating final addresses. Specifically, a very large amount of flexibility is required in order to generate the series of base or seed addresses (i.e., initial addresses) that can be used by multiple command multipliers 220 to generate a full set of useful memory addresses (i.e., final addresses) in each specific embedded memory array 240. To accomplish this flexibility, the address generator 212 of the BIST controller 210 can comprise a combination of counters 401 and an ALU 402.

Figure 6:
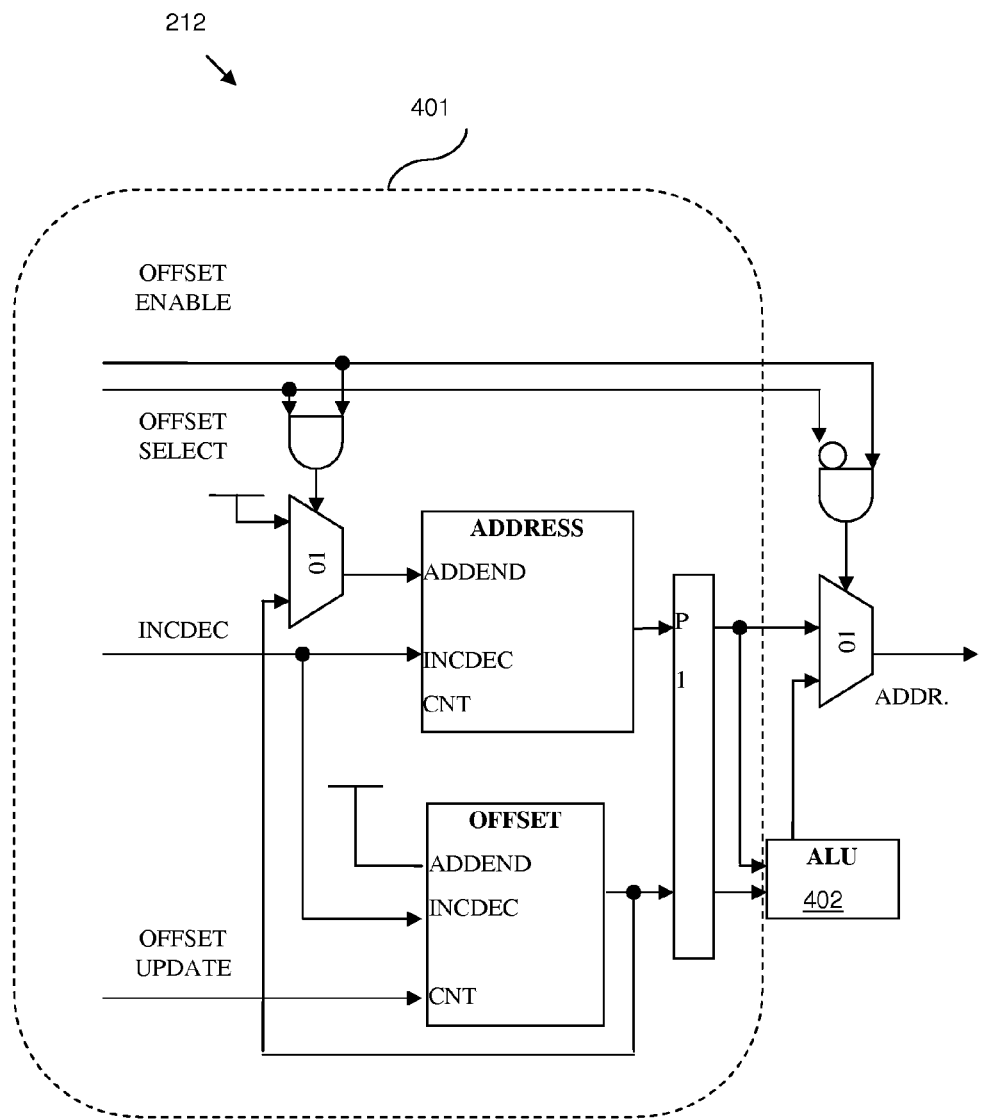
FIG. 6 is a schematic diagram illustrating an exemplary address generator that can be incorporated into the controller of FIG. 4.

More specifically, as illustrated in FIG. 6, the BIST engine 210 can comprise address generator 212 comprising four counters 401 (bank, refresh bank, row and column), each of which include two sub-counters (i.e., a main counter and an offset counter). These counters can be controlled by a decode of the BIST instruction in the address generation block. The main counters can be used to generate the base memory address and the offset counters can be used to provide an offset for the base address and also to provide a register for the count-by feature.

These counters can be of varying sizes and can, for example, be associated with the typical DRAM memory address fields of row (e.g., 9 bits for the main counter, 5 bits for the offset counter), bank and refresh bank (e.g., 5 bits for both the main and offset counters, and column (3 bits for both the main and offset counters. Thus, the address generator 212 can be capable of creating a full 22 bit address field. The command multiplier 220 can be free to manipulate this address field as necessary to work with a particular memory configuration. Furthermore, each address counter in the BIST engine 210 can be adapted to support the following basic controls as encoded in the instruction: hold; count each cycle; count on carry (carry can be any combination of the carry signals from the other counters); reset to the start state (minimum count value when incrementing, or maximum count value when decrementing); or issue a "home" value.

The counter maximum and minimum count values can be programmed via data instructions to any value (as long as the maximum value is greater than the minimum). The counter home value can also be programmed in this way. Each address counter also has an offset counter associated with it. The offset counter can be used for two functions: in one mode it is used to modify the output of the address counter when the address counters are incremented or decremented by one, and in the other mode it is used to modify the counter increment or decrement step value to something other than one (e.g. increment by two or four, or "count by" 2 or 4). A data instruction is used to select whether the offset counter is used to modify the address counter output or change the address counter addend. When the offset counter is used as the address counter addend it can be enabled or disabled via a field in the BIST execution instruction (allowing the address counters to update by one or by the value in the offset counter in an easily selectable manner). The offset counters themselves are updated using special jump instructions that both update the program counter and update (increment or decrement by one) or reset the offset counter.

In an exemplary embodiment the architecture 200 can be designed specifically to work at 1 GHz at 0.9V in a 65 nm ASIC technology and to test at least one embedded DRAM macro with a 4 ns random row cycle time. This DRAM macro can be compliable from 0.25 Mb kernels that can be tiled up to 32 banks high and 4 data words wide. Each kernel can consist of 256 word lines (rows) by 128 or 146 data lines (with 8 bits per data line selected by a column address). This DRAM can be accessed in a four bank interleave mode, where different banks can be activated (read or written) at the same time. In this mode a single bank access takes four clock cycles (enabling a bank access to complete at the random row cycle time), but a new bank access can be initiated on each clock cycle, or every 1 ns. This DRAM architecture also supports refresh of the array concurrently with read and write operations in order to maximize array availability (referred to as concurrent refresh).

Figure 7:
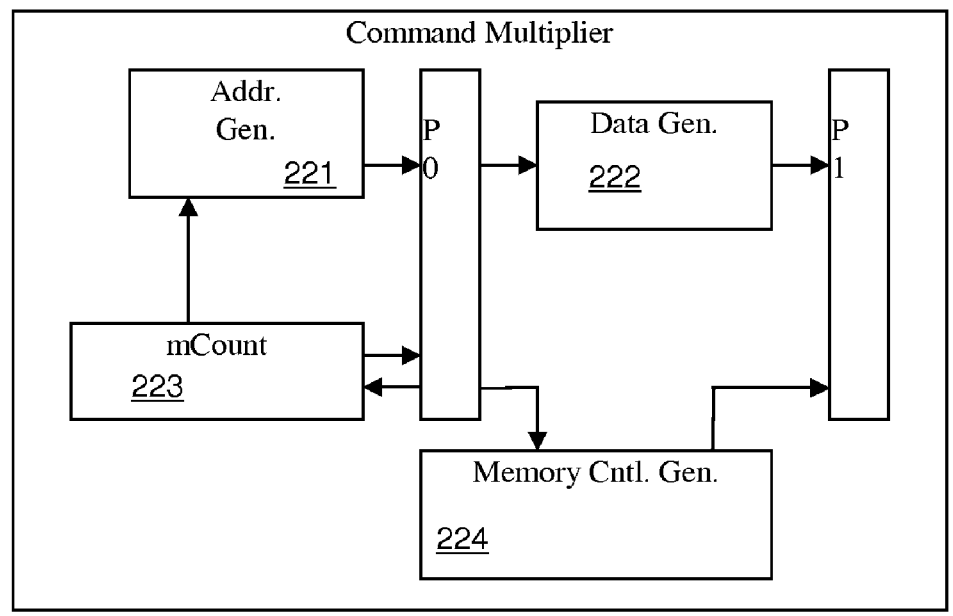
FIG. 7 is a schematic diagram illustrating an exemplary command multiplier that can be incorporated into the BIST architecture of FIG. 2.

FIG. 7 illustrates an exemplary command multiplier 220 created to work specifically with the above-described DRAM which can be tuned to provide flexible 1 GHz operation in as an area efficient manner as possible. In the normal mode, the command multiplier 220 can further be adapted to work with a normal multiplication factor (N) of 4. Thus, each BIST instruction that is received by the command multiplier 220 and that contains the normal mode code can be processed through a two stage pipeline to generate the sequence of four memory test controls, data/bit writes and addresses. In the bypass mode, this command multiplier 220 work with a multiplication factor (N) of 1. Thus, each BIST instruction that is received by the command multiplier 220 and that contains the bypass mode code can be processed through a two stage pipeline to generate a single set of memory test controls, data/bit writes and addresses. The multiplication process invoked by the command multiplier 220 can be controlled by a two bit counter 223 referred to as mCount. This counter 223 can be adapted to increment every cycle, when the command multiplier 220 is active (i.e., when the command multiplier 220 is in the normal mode). That is, an mCount of 0 produces the first cycle of the test sequence, an mCount of 1 produces the second cycle of the test sequence, etc. However, when the command multiplier 220 is in the bypass mode, the mCount remains at 0, thereby allowing the BIST instruction to be translated directly into the first cycle of the test sequence.

As mentioned above, by providing command multipliers 220 with multiple different operating modes, the embodiments disclosed herein provide options for balancing testing flexibility with operating speed. Specifically, the bypass mode incurs minimal penalties as implemented (i.e., operating at the lower frequency); however, it allows the BIST engine 210 to directly issue test sequences to the memory 240 under test, as needed. The bypass mode further allows the memory to be addressed with all of the flexibility inherent in the programmable BIST engine 210, albeit at the slower frequency of the BIST engine 210. The bypass mode can thus be used to provide flexibility that a simplified command multiplier design may lack. For example, if certain failure modes are present at reduced frequencies but require additional data, address, or command sequence flexibility, then the implementation of a bypass mode can be enormously helpful. In the case of the DRAM described above, the BIST engine 210 is capable of running at the normal random row cycle, so the majority of testing is done in command multiplication bypass, in order to take advantage of all the BIST flexibility. The command multiplication flexibility centers around the sort of address, data, and command sequences necessary in bank interleave mode, which is best tested at the command multiplier maximum frequency outside of bypass mode. This mixture of test sequences run in and out of bypass mode allows for the concentration of command multiplication test circuit resources where it matters most and can result in the most efficient use of test time and area possible.

Figure 8:
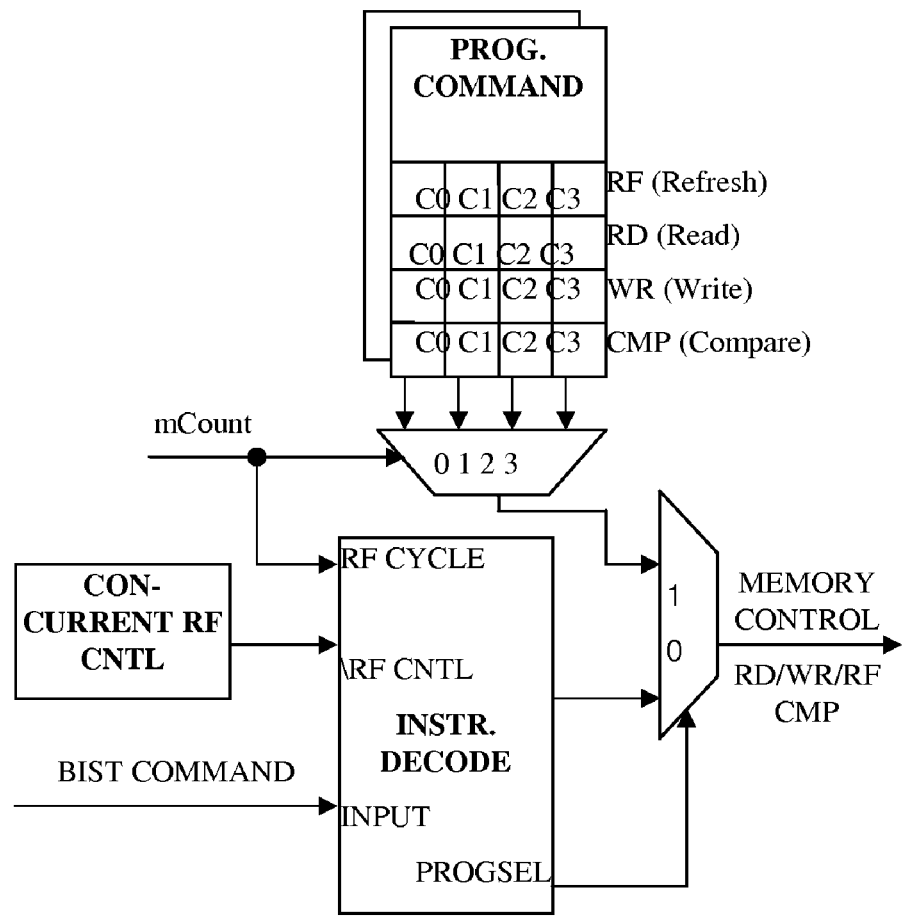
FIG. 8 is a schematic diagram illustrating an exemplary memory controls generator that can be incorporated into the command multiplier of FIG. 7.

Referring to FIG. 8, the command generation logic 224 can be adapted to take each generic command (each comprising, for example, an x-bit word command, such as a 5-bit word command) from the BIST controller 210 and to decode it into a format understandable by a specific memory array (e.g., a specific DRAM). This decode generates negative active read, write, and refresh controls along with the compare enable used by the self repair circuitry (see item 225 of FIG. 2) to distinguish between read data that should be compared to expected data results and dummy read data that should just be ignored. The decode value can take into account the mCount value. For example, a BIST instruction that signifies a blanket read sequence will be multiplied into four cycles with the DRAM read signal activated. A BIST instruction that signifies a read-write sequence will be translated into a series of DRAM commands where the read signal is activated for a cycle followed by the write signal (followed by another read and another write cycle). This decode logic 224 can also be adapted to provide for the generation of blanket read, dummy read, write, refresh, and noop sequences, read/write or write/read sequences, and concurrent refresh combined with all of the previous sequences.

Additionally, two fully programmable sequences can be made available that can be selected by the BIST command instead of any of the predefined decodes listed previously. The programmable sequences can be controlled by multiplication modifiers that consist of two 16 bit registers which can be programmed via BIST data instructions. The registers contain four entries each for the read, write, refresh, and compare signals. Any combination of active and inactive settings for each of the signals over four cycles can be programmed into the registers allowing for full test command sequence flexibility. The programmed values for the read, write, refresh, and compare signals are then selected by the mCount value.

Finally, a two bit register can be provided that is adapted to modify how often concurrent refreshes are issued when a command calls for a concurrent refresh. The register can be programmed via BIST data instructions and can be adapted to allow for concurrent refresh to occur on every cycle, even cycles, odd cycles or the first cycle (as determined by the mCount value).

Figure 9:
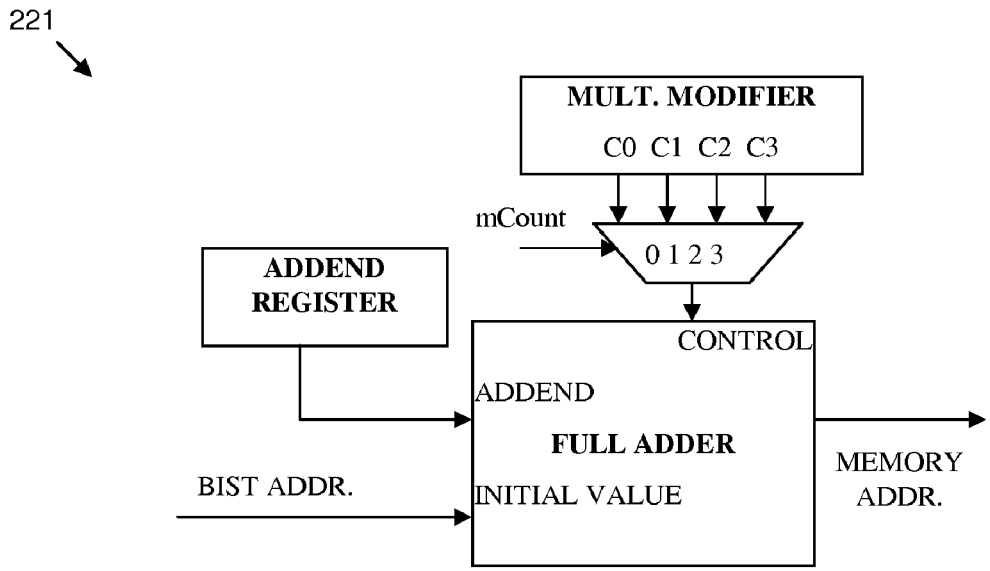
FIG. 9 is a schematic diagram illustrating an exemplary address generator that can be incorporated into the command multiplier of FIG. 7.

Referring to FIG. 9, the address generation logic 221 can be adapted to take the address contained in the BIST instruction received from the BIST controller 210 and processes it through a set of full adders. The adders can be organized such that there is one per DRAM row, column, bank, and refresh bank address. The adders can be adapted to automatically load the initial address value from the BIST controller 210 whenever the counter 223 mCount is 0. On subsequent mCount values, the adder can take the initial BIST supplied address and can generate a new address based on the currently selected multiplication modifier (generated from a 6 bit register that has a 2 bit output selected by mCount). The multiplication modifier can cause the counter to increment, decrement, hold, or reset to the initial BIST supplied address on each cycle. The adder can add or subtract by 1, 2, 4, or 8 (addend of 8 not available for the 3 bit column adder). Both the contents of the multiplication modifier register and the update value register can be programmed by a BIST data instruction, allowing for easy modification of the count sequence within a single BIST pattern. FIG. 9 depicts an exemplary bank address generation logic, all other address generation circuits can be adapted to operate in a similar manner. The multiplied address values then pass into the data generation logic and a pipe register, which is used to align the address with the final data value. This staging is necessary because the data will be scrambled or modified by the address value to produce physical data, checkerboard, word line stripes, etc.

Figure 10:
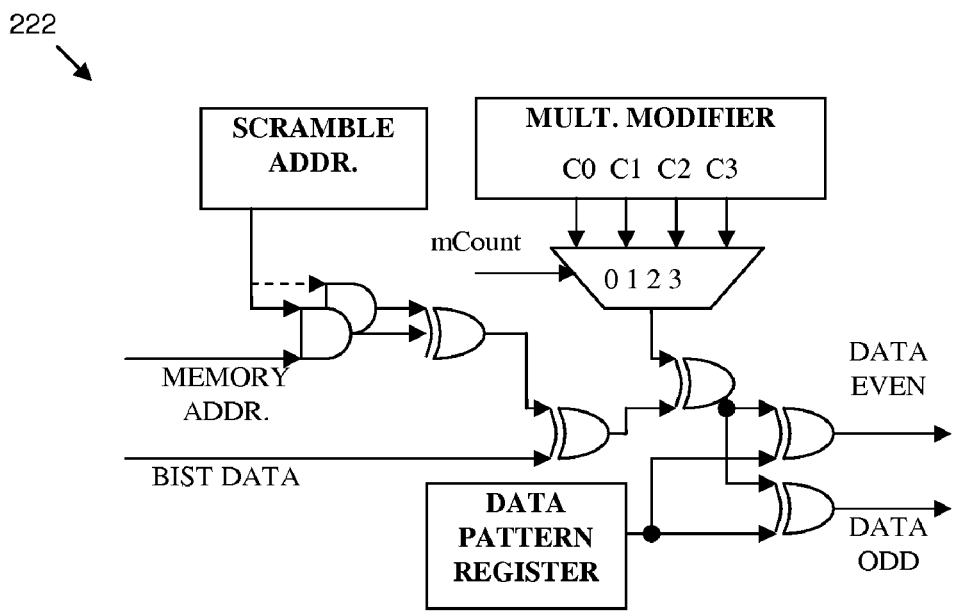
FIG. 10 is a schematic diagram illustrating an exemplary data generator that can be incorporated into the command multiplier of FIG. 7.

Referring to FIG. 10, the data generation logic 222 can be adapted to data scramble by essentially taking the data bit value from the captured BIST instruction and logically XOR combining it with the scramble value (i.e., a logical AND of the address with the scramble address, followed by a bit wise XOR) to form the un-multiplied data value. This value can then be XOR combined with the currently selected multiplication modifier (generated from a 4 bit register that has a 1 bit output selected by the mCount value) and then XOR combined again with the two bit (even and odd) data pattern. Like all other control registers discussed herein, the multiplication modifier register, the scramble address, and the data pattern are programmed via a BIST data instruction prior to running the pattern. In the bypass mode, the multiplication value is suppressed, allowing the un-multiplied data value to pass to the output. The bit write multiplication logic works in an analogous way.

It should be noted that since each command multiplier must be placed proximal to the memory under test, the ability to share the command multiplier circuit between identical memory arrays is reduced but possible. Thus, a single command multiplier can be used to locally process the initial set of instructions from the controller so that the translated instructions can be used to locally perform the memory array-specific test functions on multiple identical memory arrays.

It should also be noted that in the disclosed architecture 200, the command multiplication circuitry 220 must be able to successfully transfer data from the BIST clock domain into the high frequency domain, process it over N cycles to produce N test sequences in a continuous fashion. Therefore, in order to maintain the amount of synchronization necessary to ensure correct operation of the command multiplier 220 a robust chip timing environment can be provided that allows for minimal skew between the BIST clock domain and the command multiplier clock domain and for reduced jitter in either domain.

Figure 11:
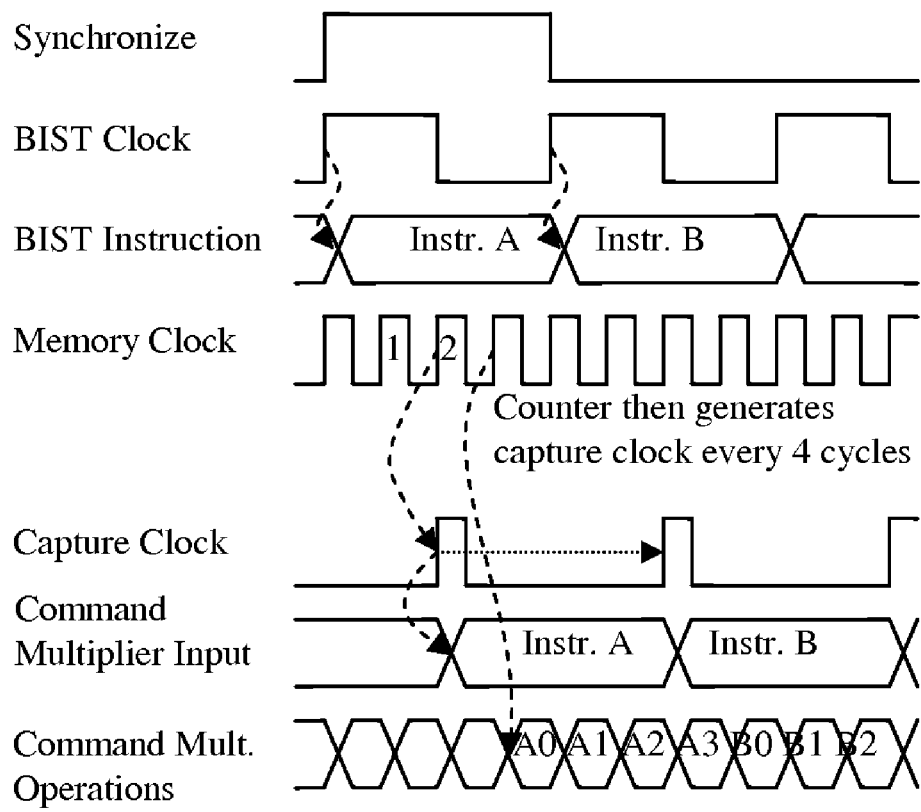
FIG. 11 is timing diagram illustrating an exemplary synchronization technique.

Alternatively, synchronization circuits 228 can be either connected between the controller 210 and each command multiplier 220 or embedded in each command multiplier 220. This circuit 228 can be adapted to sample the internal BIST clock with the higher frequency command multiplier clock and determine an optimal internal cycle for capturing the BIST data into the high frequency domain (e.g. capture data on the second internal cycle after the BIST clock rising edge). Once the optimal internal cycle (i.e., the cycle closest to the middle of the data valid window) has been determined, the command multiplier 220 would then simply capture data from the BIST every N cycles after that. FIG. 11 illustrates this synchronization technique. This will capture correct data assuming that the data valid window is larger than the expected clock jitter. It should be noted that to make this even more robust, the command multiplier 220 can be forced to re-synchronize using a command from the programmable BIST engine 210. Thus, if the BIST engine 210 is executing a test sequence where the clock frequencies need to change, a re-synchronization command can simply be issued.

Figure 12:
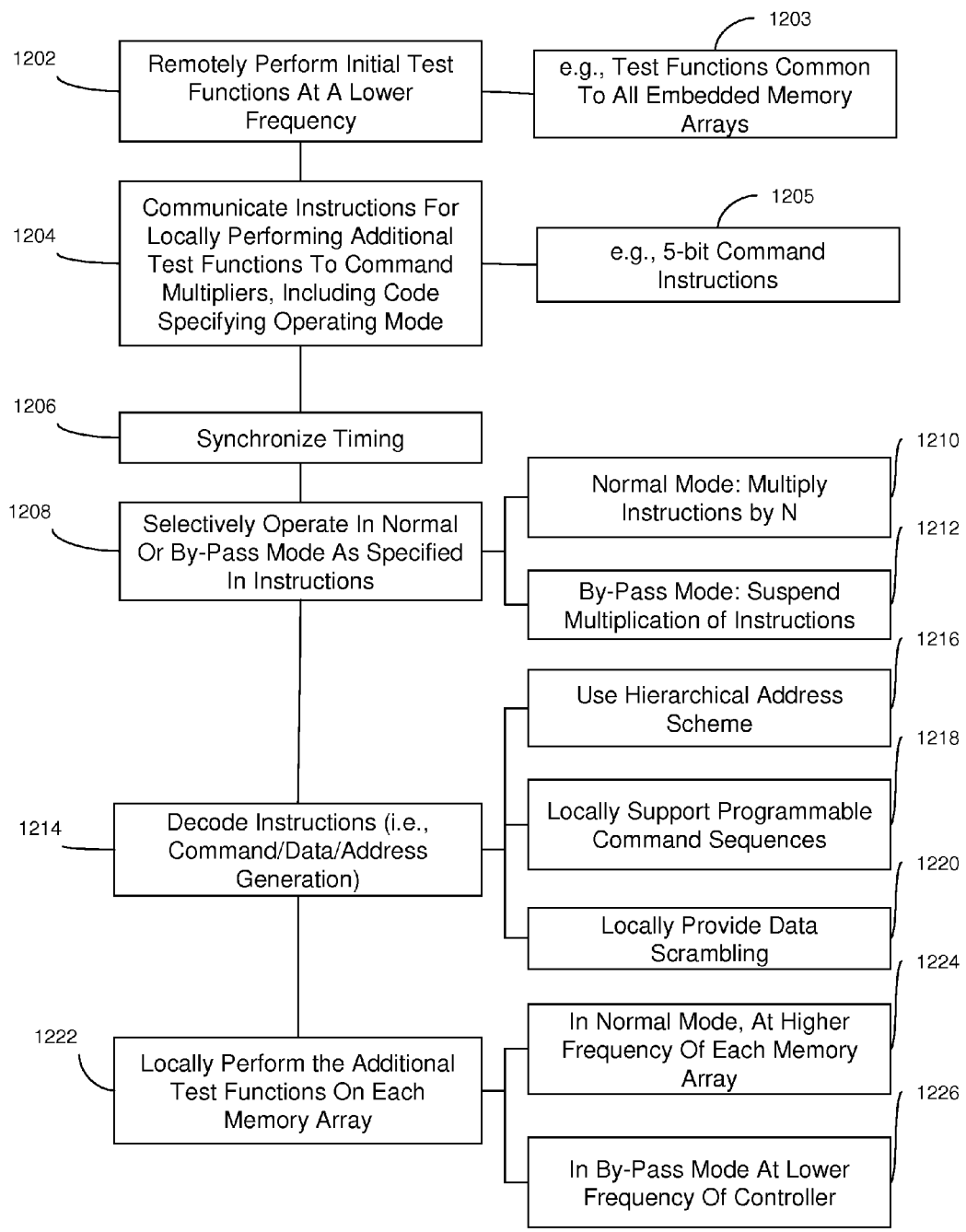
FIG. 12 is a flow diagram illustrating an embodiment of a method of the invention.

Also, disclosed herein are embodiments of a method for performing a hybrid built-in self-test process in conjunction with the BIST architecture described above. Referring to FIG. 12 in combination with FIG. 2, the method embodiments comprise remotely performing, by a BIST logic controller 210, initial or base test functions that are common to a plurality of embedded memory arrays (1202-1203). These initial test functions can be performed at the lower operating frequency of the BIST logic controller 210 rather than at the higher operating frequency of the various embedded memory arrays.

Additionally, the method embodiments can comprise communicating, by the BIST logic controller 210 to a plurality of command multipliers 220, instructions for performing additional test functions locally on the various memory arrays 240 (1204). The same set of generic instructions can be communicated to each command multiplier and these instructions can specify (e.g., by code) the operating mode (i.e., the normal mode or the bypass mode) to be used by the individual command multipliers 220. Optionally, in order to ensure the correct transfer of data during this communication process, timing between the controller 210 and the various command multipliers 220 can be individually synchronized, e.g., by synchronization circuit 228 (1206).

Once the instructions have been received, the command multipliers can each selectively operate in either the normal mode (i.e., the first mode) or the bypass mode (i.e., the second mode), as specified in the instructions (1208). That is, for each specific command multiplier 220, operating in the normal mode comprises multiplying the instructions so that the additional test functions are performed on a specific embedded memory array at the higher operating frequency of the specific embedded memory array (1210). For example, each specific embedded memory array 240 can have a normal operating frequency that is n times a lower operating frequency (e.g., n times the lower operating frequency of the BIST logic controller). The value of n can vary between different embedded memory arrays that are connected to the same BIST logic controller. Thus, for each specific command multiplier 220, operating in the normal mode, comprises multiplying each of the instructions in the set by the n value of a specific embedded memory array. If multiple embedded memory arrays are each in communication with the same BIST logic controller and these embedded memory arrays have different n values, then the same set of the instructions may be multiplied by a different factor n depending upon the memory array being tested. Thus, when operating in the normal mode, additional test functions may be performed locally on different embedded memory arrays at varying frequencies.

Whereas, operating in the bypass mode comprises suspending multiplications of the instructions (i.e., multiplying the instructions by 1) so that the additional test functions are performed locally on the embedded memory arrays at the lower operating frequency of the BIST logic controller (1212). Thus, when operating in the bypass mode, additional testing functions are performed locally by different embedded memories at the same lower frequency.

Furthermore, the process 1204 of communicating instructions to the command multipliers can comprise communicating the same set of generic instructions (i.e., instructions common to all of the memory arrays) to the command multipliers. These generic instructions can each comprise, for example, an x-bit word command, such as a 5-bit command instruction (1205). Furthermore, these generic instructions can be decoded (i.e., translated) (e.g., by a command multiplier) into the necessary commands for performing the additional test functions locally (1214). This decoding process 1214 can include local command, data and address generation. This translation process, by each specific command multiplier 220, can be specific to a specific embedded memory array (i.e., can be memory array-specific). These different translations can be based on the memory array type (e.g., dynamic random access memory (DRAM), static random access memory (SRAM), content-addressable memory (CAM), etc.), size, frequency, etc. Thus, the same set of instructions may be translated differently by each specific embedded memory array and, therefore, performed differently.

The BIST method embodiments disclosed herein can also include several other features. For example, the BIST method embodiments can comprise decoding the instructions, using a hierarchical address counter scheme (1216). That is, initial addresses for the instructions can be generated remotely (e.g., by a first or remote address generator in the BIST logic controller 210) and final or local addresses (e.g., by a second or local address generator in command multiplier) can be generated locally.

Other features of the BIST method embodiments can comprise, in each of the embedded memory arrays, locally supporting programmable command sequences (1218) and/or locally providing data scrambling such that the data scrambling is memory array-specific (1220).

By selectively performing memory array-specific test functions in one of multiple different modes, the method embodiments provide options for balancing testing flexibility with operating speed (1222). For example, performing the additional test functions locally in the normal mode allows the additional test functions to be performed at the higher operating frequency (i.e., the same operating frequency as the corresponding embedded memory array) with limitations on test pattern flexibility (1224). Whereas, performing the additional test functions locally in the bypass mode allows the additional test functions to be performed at the lower operating frequency without the limitations on test pattern flexibility (1226).

Therefore, disclosed are embodiments of a built-in self-test (BIST) architecture that incorporates a standalone BIST logic controller that operates at a lower frequency to remotely perform test functions common to a plurality of embedded memory arrays. The BIST architecture also incorporates command multipliers that are associated with the embedded memory arrays and that selectively operate in one of two different modes: a normal mode or a bypass mode. In the normal mode, instructions from the BIST logic controller are multiplied so that memory array-specific test functions can be performed locally at the higher operating frequency of each specific memory array. Whereas, in the bypass mode, multiplication of the instructions is suspended so that memory array-specific test functions are performed locally at the lower operating frequency of the controller. The ability to vary the frequency at which test functions are performed locally, allows for more test pattern flexibility.

What is claimed is:

1. A built-in self test (BIST) architecture comprising:
   a controller adapted to operate at a lower operating frequency than a plurality of associated memory arrays; and
   command multipliers in communication with said controller and associated with said memory arrays,
   wherein said controller is further adapted to communicate, to said command multipliers, instructions for performing test functions on said memory arrays, and wherein each specific command multiplier is adapted to selectively operate in one of two modes:
    a first mode, wherein said specific command multiplier is adapted to multiply said instructions so that said test functions are performed at a higher operating frequency of said specific memory array, and
    a second mode, wherein said specific command multiplier is adapted to suspend multiplication of said instructions so that said test functions are performed at said lower operating frequency.

2. The BIST architecture of claim 1, wherein said instructions specify one of said first mode and said second mode,
    wherein said higher operating frequency is n times said lower operating frequency,
    where n comprises a positive number and may differ between said memory arrays, and
    wherein said command multipliers are adapted to multiply each of said instructions by n when said instructions specify said first mode.

3. The BIST architecture of claim 1, wherein said first mode allows said test functions to be performed at said higher operating frequency with limitations on test pattern flexibility and wherein said second mode allows said test functions to be performed at said lower operating frequency without said limitations on test pattern flexibility.

4. The BIST architecture of claim 1, wherein said controller further comprises a first address generator adapted to generate initial addresses for said instructions and wherein said command multipliers each further comprise a second address generator adapted to generate final addresses.

5. The BIST architecture of claim 1, wherein said controller is adapted to communicate the same set of instructions to all said command multipliers,
    wherein said command multipliers are each adapted to translate said same set of instructions into commands for performing said test functions locally, and
    wherein, for each of said command multipliers, said commands are specific to said specific memory array.

6. The BIST architecture of claim 1, wherein said command multipliers are each further adapted to support programmable command sequences.

7. The BIST architecture of claim 1, wherein said command multipliers are each further adapted to provide data scrambling specific to said corresponding memory array.

8. A built-in self test (BIST) architecture comprising:
    a controller adapted to operate at a lower operating frequency than a plurality of associated memory arrays; and
    command multipliers in communication with said controller and associated with said memory arrays,
    wherein said controller is further adapted to communicate, to said command multipliers, instructions for performing test functions on said memory arrays,
    wherein said controller further comprises a first address generator adapted to generate initial addresses for said instructions,
    wherein said command multipliers each further comprise a second address generator adapted to generate final addresses for said instructions, and
    wherein each specific command multiplier is adapted to selectively operate in one of two modes:
        a first mode, wherein said specific command multiplier is adapted to multiply said instructions so that said test functions are performed at a higher operating frequency of said specific memory array, and
        a second mode, wherein said specific command multiplier is adapted to suspend multiplication of said instructions so that said test functions are performed at said lower operating frequency.

9. The BIST architecture of claim 8, wherein said instructions specify one of said first mode and said second mode,
    wherein said higher operating frequency is n times said lower operating frequency,
    where n comprises a positive number and may differ between said memory arrays, and
    wherein said command multipliers are adapted to multiply each of said instructions by n when said instructions specify said first mode.

10. The BIST architecture of claim 8, wherein said first mode allows said test functions to be performed at said higher operating frequency with limitations on test pattern flexibility and wherein said second mode allows said test functions to be performed at said lower operating frequency without said limitations on test pattern flexibility.

11. The BIST architecture of claim 8, wherein said controller is adapted to communicate the same set of instructions to all said command multipliers,
    wherein said command multipliers are each adapted to translate said same set of instructions into commands for performing said test functions locally, and
    wherein, for each of said command multipliers, said commands are specific to said specific memory array.

12. The BIST architecture of claim 8, wherein said command multipliers are each further adapted to support programmable command sequences.

13. The BIST architecture of claim 8, wherein said command multipliers are each further adapted to provide data scrambling specific to said corresponding memory array.

14. A built-in self test (BIST) architecture comprising:
    a controller adapted to operate at a lower operating frequency than a plurality of associated memory arrays;
    command multipliers in communication with said controller and associated with said memory arrays,
    wherein said controller is further adapted to communicate, to said command multipliers, instructions for performing test functions on said memory arrays, and
    wherein each specific command multiplier is adapted to selectively operate in one of two modes:
        a first mode, wherein said specific command multiplier is adapted to multiply said instructions so that said test functions are performed at a higher operating frequency of said specific memory array, and
        a second mode, wherein said specific command multiplier is adapted to suspend multiplication of said instructions so that said test functions are performed at said lower operating frequency; and
    synchronization circuits adapted to provide synchronization between said command multipliers and said controller.

15. The BIST architecture of claim 14, wherein said synchronization circuits comprise one of separate circuits between said command multipliers and said controller and embedded circuits within said command multipliers.

16. The BIST architecture of claim 14, wherein said instructions specify one of said first mode and said second mode,
    wherein said higher operating frequency is n times said lower operating frequency,
    wherein n comprises a positive number and may differ between said memory arrays, and
    wherein said command multipliers are adapted to multiply each of said instructions by n when said code specifies said first mode.

17. The BIST architecture of claim 14, wherein said first mode allows said test functions to be performed at said higher operating frequency with limitations on flexibility and wherein said second mode allows said test functions to be performed at said lower operating frequency without said limitations on flexibility.

18. The BIST architecture of claim 14, wherein said controller further comprises a first address generator adapted to generate initial addresses for said instructions and wherein said command multipliers each further comprise a second address generator adapted to generate final addresses.

19. The BIST architecture of claim 14, wherein said controller is adapted to communicate the same set of instructions to all said command multipliers,
wherein said command multipliers are adapted to translate said same set of instructions into commands for performing said test functions locally, and
wherein, for each said specific command multiplier, said commands are specific to said specific memory array.

20. The BIST architecture of claim 14, wherein said command multipliers are each further adapted to support programmable command sequences.

21. The BIST architecture of claim 14, wherein said command multipliers are each further adapted to provide data scrambling specific to said memory array.

22. A built-in self test (BIST) method comprising:
receiving, by a plurality of command multipliers from a controller, instructions for performing test functions on a plurality of memory arrays, wherein said controller has a lower operating frequency relative to higher operating frequencies of said memory arrays; and
selectively performing, by said command multipliers, said test functions at one of said higher operating frequencies and said lower operating frequency as specified by said instructions.

23. The method of claim 22, wherein said higher operating frequency is n times said lower operating frequency, n comprising a positive number and
wherein said performing of said test functions at said higher operating frequency comprises multiplying each of said instructions by n.

24. The method of claim 22, wherein said method further comprises translating said instructions into commands for performing said test functions such that said commands are memory array-specific.

25. The method of claim 22, wherein said performing of said test functions at said higher operating frequency limits test pattern flexibility and wherein said performing of said test functions at said lower operating frequency does not limit said test pattern flexibility.

26. The method of claim 22, further comprising using a hierarchical addressing scheme.

27. The method of claim 22, further comprising locally supporting programmable command sequences.

28. The method of claim 22, further comprising locally providing data scrambling such that said data scrambling is memory array-specific.

29. A built-in self test (BIST) method comprising:
communicating, by a controller to a plurality of command multipliers, instructions for performing test functions on a plurality of memory arrays, wherein said controller operates at a lower operating frequency than said memory arrays and wherein said instructions specify one of a first mode and a second mode;
synchronizing, by a plurality of synchronization circuits, timing between said controller and each of said command multipliers; and
selectively operating, by said command multipliers, in one of said first mode and said second mode,
wherein, for each specific command multiplier, said operating in said first mode comprises multiplying said instructions so that said test functions are performed on a specific memory array at a higher operating frequency of said specific memory array, and
wherein, for said each specific command multiplier, said operating in said second mode comprises suspending multiplication of said instructions so that said test functions are performed on said specific memory array at said lower operating frequency.

30. The method of claim 29, wherein said higher operating frequency is n times said lower operating frequency,
wherein n comprises a positive whole number and may differ between said memory arrays, and
wherein said multiplying comprises multiplying each of said instructions by n when said instructions specify said first mode.

31. The method of claim 29, wherein said communicating comprises communicating a same set of instructions to all of said command multipliers and wherein said method further comprises, for each of said memory arrays, uniquely translating said same set of command instructions into commands for performing said test functions locally such that said commands are memory array-specific.

32. The method of claim 29, wherein said performing of said test functions in said first mode allows said test functions to be performed at said higher operating frequency with limitations on test pattern flexibility and wherein said performing of said test functions in said second mode allows said test functions to be performed at said lower operating frequency without said limitations on test pattern flexibility.

33. The method of claim 29, further comprising using a hierarchical addressing scheme.

34. The method of claim 29, further comprising, for each of said memory arrays, locally supporting programmable command sequences.

35. The method of claim 29, further comprising, for each of said memory arrays, locally providing data scrambling such that said data scrambling is memory array-specific.

* * * * *